US012660608B2

(12) United States Patent
Okuda

(10) Patent No.: US 12,660,608 B2
(45) Date of Patent: Jun. 16, 2026

(54) SEMICONDUCTOR DEVICE AND MANUFACTURING METHOD OF THE SEMICONDUCTOR DEVICE

(71) Applicant: Kioxia Corporation, Tokyo (JP)

(72) Inventor: Shinya Okuda, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 738 days.

(21) Appl. No.: 17/930,278

(22) Filed: Sep. 7, 2022

(65) Prior Publication Data

US 2023/0299004 A1 Sep. 21, 2023

(30) Foreign Application Priority Data

Mar. 18, 2022 (JP) ................................. 2022-043838

(51) Int. Cl.
*H10P 95/90* (2026.01)
*H10P 14/60* (2026.01)
*H10W 20/47* (2026.01)
*H10W 72/00* (2026.01)
*H10W 72/90* (2026.01)
*H10W 80/00* (2026.01)

(52) U.S. Cl.
CPC ......... *H10W 20/47* (2026.01); *H10P 14/6339* (2026.01); *H10P 95/90* (2026.01); *H10W 72/01953* (2026.01); *H10W 72/923* (2026.01); *H10W 72/952* (2026.01); *H10W 80/701* (2026.01)

(58) Field of Classification Search
CPC ... H01L 23/53295; H01L 24/05; H01L 24/08;
H01L 24/04; H01L 24/07; H10W 80/701;
H10W 80/023; H10W 80/312; H10W
72/01953; H10W 72/923; H10W 72/952;
H10W 72/90; H10W 72/921; H10W
72/934; H10W 72/9415; H10W 72/00;
H10W 72/019; H10W 20/47; H10W
99/00; H10W 90/792; H10P 14/6339;
H10P 95/90
See application file for complete search history.

(56) References Cited

U.S. PATENT DOCUMENTS 6,962,835 B2 11/2005 Tong et al.
10,910,782 B2 2/2021 Vandroux et al.
(Continued)

FOREIGN PATENT DOCUMENTS

JP 2013-168419 A 8/2013
JP 2014-187166 A 10/2014
(Continued)

*Primary Examiner* — Omar F Mojaddedi
(74) *Attorney, Agent, or Firm* — Oblon, McClelland, Maier & Neustadt, L.L.P.

(57) ABSTRACT

A semiconductor device includes a substrate, a first insulating film provided above the substrate, a second insulating film disposed between the substrate and the first insulating film, a first metal pad provided in the first insulating film, and a second metal pad provided in the second insulating film, the second metal pad being bonded to the first metal pad. A concentration of silicon atoms in a bonded portion of the first metal pad and the second metal pad is greater than a concentration of silicon atoms in a first portion of the first metal pad and is greater than a concentration of silicon atoms in a second portion of the second metal pad.

13 Claims, 9 Drawing Sheets

(56)                    References Cited

U.S. PATENT DOCUMENTS

| | | | |
|---|---|---|---|
| 2013/0207268 | A1 | 8/2013 | Chapelon |
| 2013/0285253 | A1* | 10/2013 | Aoki ................... H10W 10/181 |
| | | | 438/455 |
| 2014/0284744 | A1 | 9/2014 | Fujii et al. |
| 2017/0355040 | A1 | 12/2017 | Utsumi et al. |
| 2020/0006371 | A1* | 1/2020 | Huo ................... H10W 20/423 |
| 2020/0194396 | A1 | 6/2020 | Uzoh |
| 2020/0243455 | A1* | 7/2020 | Wang ............... H01L 23/53238 |
| 2021/0028135 | A1* | 1/2021 | Said ........................ H01L 25/18 |
| 2021/0091033 | A1* | 3/2021 | Pan ...................... H01L 23/585 |
| 2021/0296253 | A1* | 9/2021 | Wakatsuki ............. H01L 25/50 |
| 2022/0077090 | A1 | 3/2022 | Setta |
| 2022/0216246 | A1 | 7/2022 | Hashiguchi |

FOREIGN PATENT DOCUMENTS

| | | | |
|---|---|---|---|
| JP | 2016-119415 | A | 6/2016 |
| JP | 2018-73967 | A | 5/2018 |
| JP | 2018-528622 | A | 9/2018 |
| JP | 2020-102613 | A | 7/2020 |
| JP | 2021-141290 | A | 9/2021 |
| JP | 2021-150395 | A | 9/2021 |
| JP | 2021-150574 | A | 9/2021 |
| TW | 202137351 | A | 10/2021 |
| WO | WO 2016/060274 | A1 | 4/2016 |
| WO | WO 2016/152513 | A1 | 9/2016 |
| WO | WO 2020/235234 | A1 | 11/2020 |
| WO | WO 2021/068229 | A1 | 4/2021 |
| WO | WO 2022/046482 | A2 | 3/2022 |

* cited by examiner

*FIG. 3*

SEMICONDUCTOR DEVICE AND MANUFACTURING METHOD OF THE SEMICONDUCTOR DEVICE

CROSS-REFERENCE TO RELATED APPLICATION

This application is based upon and claims the benefit of priority from the prior Japanese Patent Application No. 2022-43838, filed on Mar. 18, 2022, the entire contents of which are incorporated herein by reference.

FIELD

Embodiments relate to a semiconductor device and a manufacturing method of the semiconductor device.

BACKGROUND

In a case where a semiconductor device is manufactured by bonding one substrate with another substrate, it is desirable to reduce bonding defects between metal pads of these substrates.

BRIEF DESCRIPTION OF THE DRAWINGS

FIG. 3 is a cross-sectional diagram illustrating part of a manufacturing process of the semiconductor device of the embodiment;

DETAILED DESCRIPTION

Figure 1:
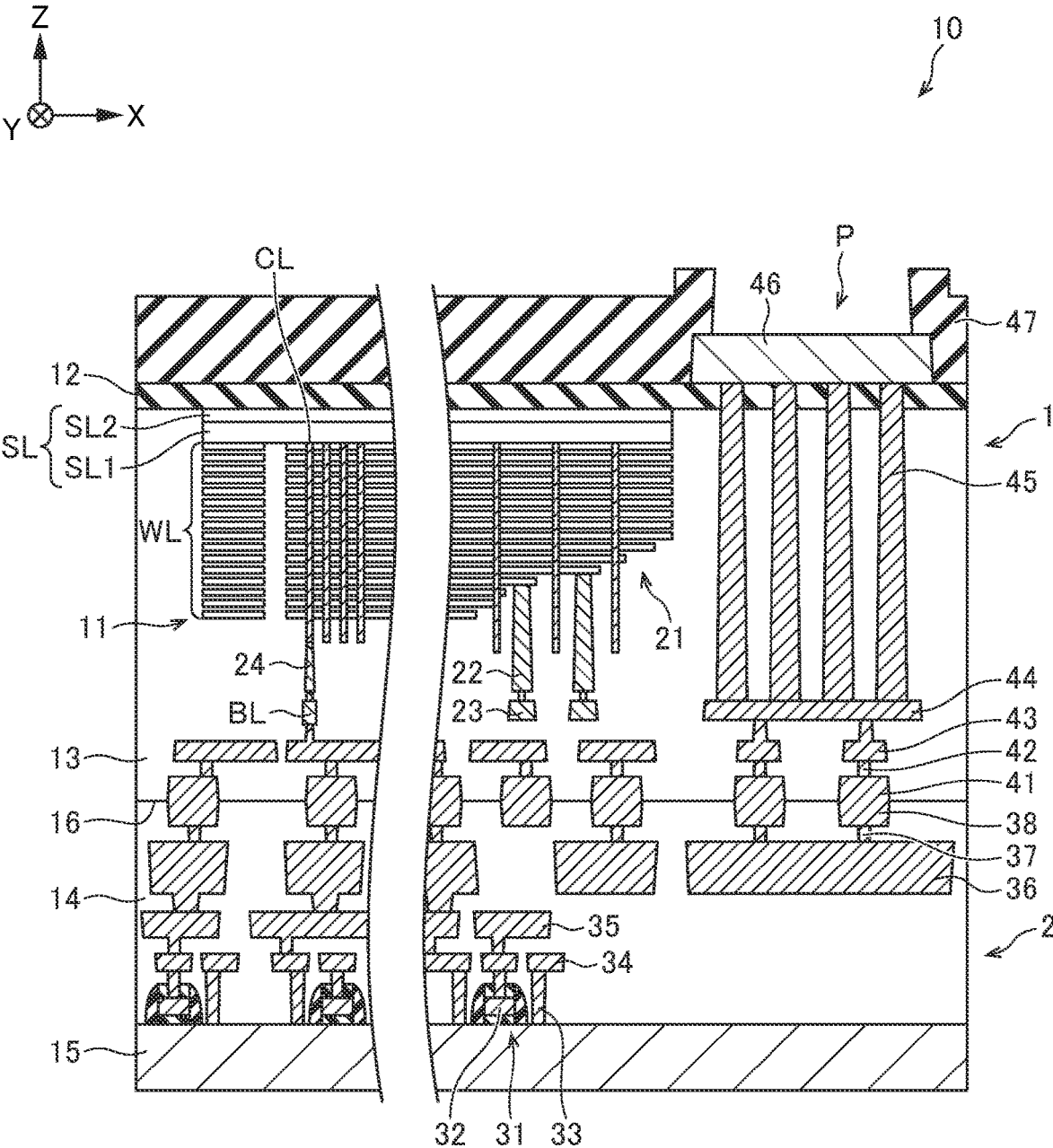
FIG. 1 is a cross-sectional diagram illustrating a schematic configuration of a semiconductor device of an embodiment.

Embodiments will be described below with reference to the drawings. To facilitate understanding of explanation, the same reference numerals will be assigned as far as possible to the same components in the respective drawings, and redundant description will be omitted.

1. Embodiments

A semiconductor device 10 illustrated in FIG. 1 is, for example, a three-dimensional memory. The semiconductor device 10 is manufactured by bonding an array wafer including an array region 1 and a circuit wafer including a circuit region 2.

In the array region 1, a memory cell array 11, an insulating film 12 and an interlayer dielectric 13 are provided. The memory cell array 11 includes a plurality of memory cells. The insulating film 12 is provided above the memory cell array 11. The insulating film 12 is, for example, an $SiO_2$ (silicon oxide) film or an SiN (silicon nitride) film. The interlayer dielectric 13 is provided below the insulating film 12. The memory cell array 11 is provided in the interlayer dielectric 13. The interlayer dielectric 13 is, for example, a laminated film including an $SiO_2$ film or an SiN film and other insulating films. In the present embodiment, the interlayer dielectric 13 corresponds to a first insulating film.

The circuit region 2 is provided below the array region 1. A thin film 16 is provided in a boundary portion (bonded portion) of the array region 1 and the circuit region 2. The thin film 16 has a thickness of an angstrom scale or a nanoscopic scale. The thin film 16 is, for example, an $SiO_2$ film, an SiN film, an SiCN (silicon carbon nitride) film, or the like. In other words, in a case where the thin film 16 is an SiN film, nitrogen atoms exist in the bonded portion, while in a case where the thin film 16 is an SiCN film, nitrogen atoms and carbon atoms exist in the bonded portion. In the following description, a case where the thin film 16 is an SiN film will be described. In the present embodiment, the thin film 16 corresponds to a third insulating film.

In the circuit region 2, an interlayer dielectric 14 and a substrate 15 are provided. The interlayer dielectric 14 is, for example, a laminated film including an $SiO_2$ film or an SiN film and other insulating films. The interlayer dielectric 14 is laminated and disposed above the interlayer dielectric 13. In the present embodiment, the interlayer dielectric 14 corresponds to a second insulating film. The substrate 15 is provided below the interlayer dielectric 14. The substrate 15 is, for example, a semiconductor substrate such as a silicon (Si) substrate. The interlayer dielectric 13 that is the first insulating film is provided above the substrate 15. The interlayer dielectric 14 that is the second insulating film is provided between the substrate 15 and the interlayer dielectric 13.

FIG. 1 indicates two directions that are parallel to a surface of the substrate 15 and perpendicular to each other as an X direction and a Y direction and indicates a direction perpendicular to the surface of the substrate 15 as a Z direction. In the following description, a +Z direction is dealt with as an upward direction, and a −Z direction is dealt with as a downward direction. The −Z direction may match a gravity direction or does not have to match the gravity direction.

In the array region 1, a plurality of word lines WL and a source line SL are provided as a plurality of electrode layers in the memory cell array 11. FIG. 1 illustrates a stepped structure portion 21 of the memory cell array 11. Each word line WL is formed to extend in the Y direction. In the present embodiment, the Y direction corresponds to a first direction horizontal to the surface of the substrate 15. Each word line WL is electrically connected to a word wiring layer 23 via a contact plug 22. A plurality of columnar portions CL are provided in the plurality of word lines WL so as to pass through the word lines WL in the Z direction. In the present embodiment, the Z direction corresponds to a second direction that intersects with the first direction, that is, the Y direction. Each columnar portion CL is electrically connected to a bit line BL via a via plug 24 and electrically connected to the source line SL. The source line SL includes a lower layer SL1 that is a semiconductor layer and an upper layer SL2 that is a metal layer.

A plurality of transistors 31 are provided in the circuit region 2. Each transistor 31 includes a gate electrode 32 provided above the substrate 15 via a gate insulating film, and a source diffusion layer and a drain diffusion layer (not illustrated) provided in the substrate 15. Further, in the circuit region 2, a plurality of contact plugs 33, a wiring layer 34 and a wiring layer 35 are sequentially provided upward from the substrate 15. The plurality of contact plugs 33 are formed so as to extend upward from the gate electrode 32, the source diffusion layer or the drain diffusion layer of the transistor 31. The wiring layer 34 includes a plurality of wirings and is connected to an upper end of the contact plug 33. The wiring layer 35 includes a plurality of wirings and is connected to the wiring layer 34.

In the circuit region 2, a wiring layer 36, a plurality of via plugs 37 and a plurality of metal pads 38 are sequentially provided upward from the wiring layer 35. The wiring layer 36 includes a plurality of wirings and is connected to the wiring layer 35. The via plugs 37 are formed so as to extend upward from the wiring layer 36. The metal pads 38 are connected to upper ends of the via plugs 37. The metal pad 38 is, for example, a metal layer including Cu (copper). In the present embodiment, the metal pad 38 corresponds to a second metal pad. The circuit region 2 functions as a control circuit (logic circuit) that controls operation of the array region 1. The control circuit, which is constituted with the transistor 31, and the like, is electrically connected to the metal pads 38.

In the array region 1, a plurality of metal pads 41, a plurality of via plugs 42, a wiring layer 43 and a wiring layer 44 are sequentially provided upward from a portion where the array region 1 contacts the thin film 16. The metal pads 41 are provided above the metal pads 38 in the circuit region 2 and are bonded to the metal pads 38. The metal pads 38 and the metal pads 41 are provided between the substrate 15 and the memory cell array 11. The metal pad 41 is, for example, a metal layer including Cu. In the present embodiment, the metal pad 41 corresponds to a first metal pad. The via plugs 42 are formed to extend upward from the metal pads 41. The wiring layer 43 includes a plurality of wirings and is connected to upper ends of the via plugs 42. The wiring layer 44 includes a plurality of wirings and is connected to the wiring layer 43. The above-described bit line BL is included in the wiring layer 44. The above-described control circuit is electrically connected to the memory cell array 11 via the metal pads 41, 38, and the like, and controls operation of the memory cell array 11 via the metal pads 41, 38, and the like.

In the array region 1, a plurality of via plugs 45, a metal pad 46 and a passivation film 47 are sequentially provided upward from the wiring layer 44. The via plugs 45 are formed to extend upward from the wiring layer 44. The metal pad 46 is provided on an upper surface of the insulating film 12 and is connected to upper ends of the plurality of via plugs 45. The metal pad 46, which is, for example, a metal film including Cu, functions as an external connection pad (bonding pad) of the semiconductor device 10 illustrated in FIG. 1. The passivation film 47 is provided on the upper surface of the insulating film 12 so that the metal pad 46 is exposed to outside. The passivation film 47, which is, for example, an insulating film such as an $SiO_2$ film, includes an opening portion P to expose an upper surface of the metal pad 46. The metal pad 46 can be connected to a mounted substrate and other devices through a bonding wire, a solder ball, a metal bump, or the like, via the opening portion P.

Figure 2:
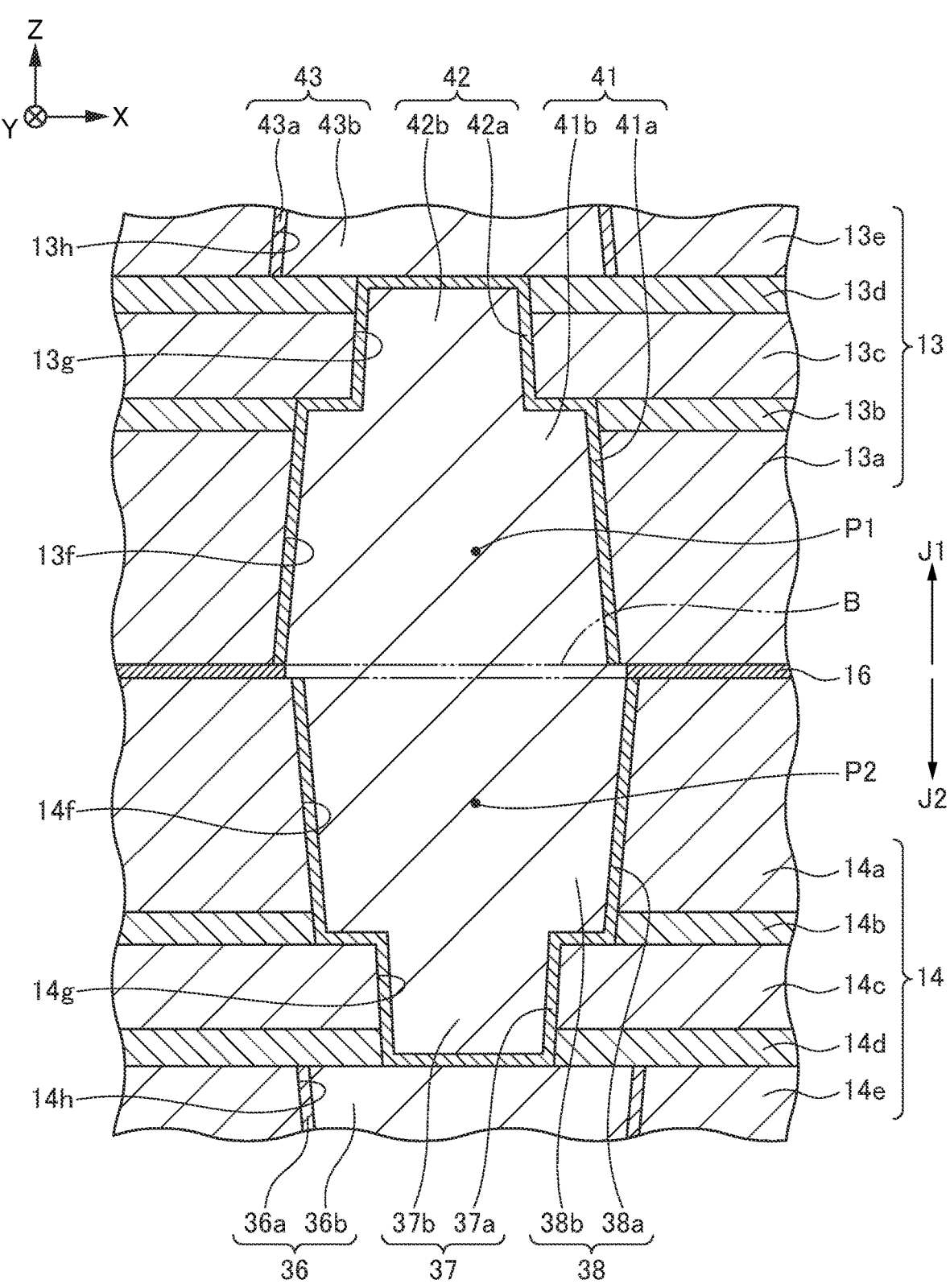
FIG. 2 is a cross-sectional diagram illustrating a cross-section structure of a portion around a metal pad of the semiconductor device of the embodiment.

Next, a structure of a portion where the metal pad 41 in the array region 1 is bonded to the metal pad 38 in the circuit region 2 will be described in detail. FIG. 2 illustrates a vertical cross-sectional diagram of one pair among a plurality of pairs of the metal pads 38 and 41 illustrated in FIG. 2.

As illustrated in FIG. 2, the interlayer dielectric 14 includes insulating films 14a to 14e. Each of the insulating films 14a, 14c and 14e is, for example, an $SiO_2$ film formed using dTEOS. The insulating film 14b is disposed in a sandwiched manner between the two insulating films 14a and 14c in the Z direction. The insulating film 14d is disposed in a sandwiched manner between the two insulating films 14c and 14e in the Z direction. The insulating films 14b and 14d are, for example, SiN films.

In the insulating films 14a and 14b, a concave groove 14f that is open on an upper surface of the insulating film 14a is formed. In the insulating films 14c and 14d, a concave groove 14g that is open on a bottom surface of the groove 14f is formed. In the insulating film 14e, a concave groove 14h that is open on a bottom surface of the groove 14g is formed.

The metal pad 38 is embedded into the groove 14f. The metal pad 38 includes a barrier metal layer 38a and a pad material layer 38b. The barrier metal layer 38a is formed on an inner wall surface and a bottom surface of the groove 14f as a thin film. The insulating films 14a and 14b are provided outside the barrier metal layer 38a. The pad material layer 38b is provided inside of the groove 14f via the barrier metal layer 38a.

The via plug 37 is embedded into the groove 14g. The via plug 37 includes a barrier metal layer 37a and a plug material layer 37b. The barrier metal layer 37a is formed on an inner wall surface of the groove 14g and at a boundary portion of the via plug 37 and the wiring layer 36 as a thin film. The insulating films 14c and 14d are provided outside the barrier metal layer 37a. The plug material layer 37b is embedded inside the groove 14g via the barrier metal layer 37a.

The wiring layer 36 is embedded into the groove 14h. The wiring layer 36 includes a barrier metal layer 36a and a wiring material layer 36b. The barrier metal layer 36a is formed on an inner wall surface of the groove 14h as a thin film. The wiring material layer 36b is embedded inside the groove 14h via the barrier metal layer 36a.

The interlayer dielectric 13 includes insulating films 13a to 13e in a similar manner to the interlayer dielectric 14. Each of the insulating films 13a, 13c and 13e is, for example, an $SiO_2$ film formed using dTEOS. The insulating film 13b is disposed in a sandwiched manner between the two insulating films 13a and 13c in the Z direction. The insulating film 13d is disposed in a sandwiched manner between the two insulating films 13c and 13e in the Z direction. The insulating films 13b and 13c are, for example, SiN films.

In the insulating films 13a and 13b, a concave groove 13f that is open on an upper surface of the insulating film 13a is formed. In the insulating films 13c and 13d, a concave groove 13g that is open on a bottom surface of the groove 13f is formed. In the insulating film 13e, a concave groove 13h that is open on a bottom surface of the groove 13g is formed.

The metal pad 41 is embedded into the groove 13f. The metal pad 41 includes a barrier metal layer 41a and a pad material layer 41b. The barrier metal layer 41a is formed on an inner wall surface and a bottom surface of the groove 13f as a thin film. The insulating films 13a and 13b are provided outside the barrier metal layer 41a. The pad material layer 41*b* is provided inside the groove 13*f* via the barrier metal layer 41*a*. The pad material layer 41*b* is bonded to the pad material layer 38*b* provided below the pad material layer 41*b*. In other words, the metal pad 38 is electrically connected to the metal pad 41.

The via plug 42 is embedded into the groove 13*g*. The via plug 42 includes a barrier metal layer 42*a* and a plug material layer 42*b*. The barrier metal layer 42*a* is formed on an inner wall surface of the groove 13*g* and at a boundary portion of the via plug 42 and the wiring layer 43 as a thin film. The insulating films 13*c* and 13*d* are provided outside the barrier metal layer 42*a*. The plug material layer 42*b* is embedded inside the groove 13*g* via the barrier metal layer 42*a*.

The wiring layer 43 is embedded into the groove 13*h*. The wiring layer 43 includes a barrier metal layer 43*a* and a wiring material layer 43*b*. The barrier metal layer 43*a* is formed on an inner wall surface of the groove 13*h* as a thin film. The wiring material layer 43*b* is embedded inside the groove 13*h* via the barrier metal layer 43*a*.

Each of the barrier metal layers 36*a*, 37*a*, 38*a*, 41*a*, 42*a* and 43*a* is, for example, a metal layer including Ti (titanium) or Ta (tantalum). Each of the pad material layers 38*b* and 41*b*, the plug material layers 37*b* and 42*b* and the wiring material layers 36*b* and 43*b* is, for example, a metal layer including Cu. Thus, the metal pads 38 and 41 are also referred to as "Cu pads".

The thin film 16 is provided at a boundary portion of the insulating film 13*a* and the insulating film 14*a*. FIG. 2 indicates a region corresponding to the thin film 16 at the boundary portion of the metal pad 38 and the metal pad 41 with a dashed-two dotted line. In the following description, the region indicated with the dashed-two dotted line will be referred to as a "boundary region B". In the present embodiment, the boundary region B corresponds to a portion where the metal pad 38 is bonded to the metal pad 41. Assuming that concentration of silicon atoms in the boundary region B is "C12", concentration of silicon atoms in an internal portion P2 of the metal pad 38 is "C1", and concentration of silicon atoms in an internal portion P1 of the metal pad 41 is "C2", concentration C12 of silicon atoms in the boundary region B satisfies "C1<C12" and satisfies "C2<C12". Note that the internal portion P2 of the metal pad 38 represents an arbitrary portion except the boundary region B among the metal pad 38. In a similar manner, the internal portion P1 of the metal pad 41 represents an arbitrary portion except the boundary region B among the metal pad 41. In the boundary region B, for example, silicon atoms of 1 atom % to 37 atom % exist. More specifically, concentration of silicon atoms in the boundary region B is, for example, 1 atom % to 33 atom % in a case where the thin film 16 is an $SiO_2$ film, is, for example, 1 atom % to 37 atom % in a case where the thin film 16 is an SiN film, and is, for example, 1 atom % to 30 atom % in a case where the thin film 16 is an SiCN film. The concentration of silicon atoms can be calculated from a composition ratio obtained by extracting an arbitrary region in an arbitrary cross-section through, for example, energy dispersive X-ray spectroscopy (EDX), or the like.

Note that a direction indicated with an arrow J1 in FIG. 2 indicates a direction away from the substrate 15 illustrated in FIG. 1 on the basis of the boundary region B of the metal pad 38 and the metal pad 41. Further, a direction indicated with an arrow J2 indicates a direction closer to the substrate 15 illustrated in FIG. 1 on the basis of the boundary region B of the metal pad 38 and the metal pad 41.

Next, a manufacturing method of the semiconductor device 10 of the present embodiment will be described.

Figure 3:
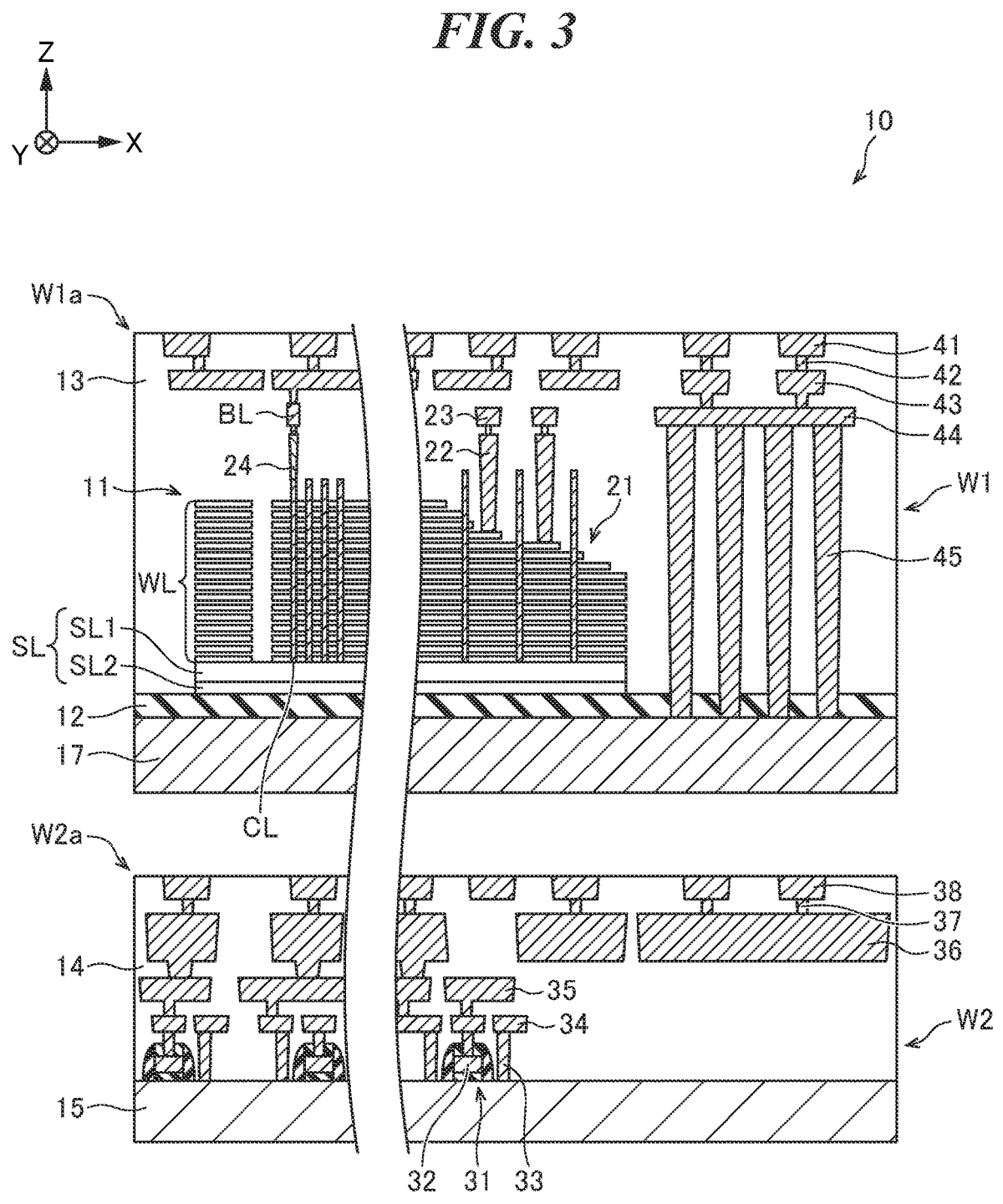

FIG. 3 illustrates an array wafer W1 including a plurality of array regions 1 and a circuit wafer W2 including a plurality of circuit regions 2. The array wafer W1 is also referred to as a "memory wafer", and the circuit wafer W2 is also referred to as a "CMOS wafer".

The array wafer W1 illustrated in FIG. 3 is oriented inversely to the array region 1 illustrated in FIG. 1. In the present embodiment, the semiconductor device 10 is manufactured by bonding the array wafer W1 and the circuit wafer W2. FIG. 3 illustrates the array wafer W1 before inversion in order to bond the array wafer W1 to the circuit wafer W2.

Note that FIG. 3 illustrates a surface W1*a* of the array wafer W1 and a surface W2*a* of the circuit wafer W2. The array wafer W1 includes a substrate 17 provided under the insulating film 12. The substrate 17 is, for example, a semiconductor substrate such as a silicon substrate.

To manufacture the semiconductor device 10, first, as illustrated in FIG. 3, the memory cell array 11, the insulating film 12, the interlayer dielectric 13, the stepped structure portion 21, the via plugs 45, the wiring layer 44, the wiring layer 43, the via plugs 42, the metal pads 41, and the like, are formed on the substrate 17 of the array wafer W1. Further, the interlayer dielectric 14, the transistors 31, the contact plugs 33, the wiring layer 34, the wiring layer 35, the wiring layer 36, the via plugs 37, the metal pads 38, and the like, are formed on the substrate 15 of the circuit wafer W2.

Figure 4A:
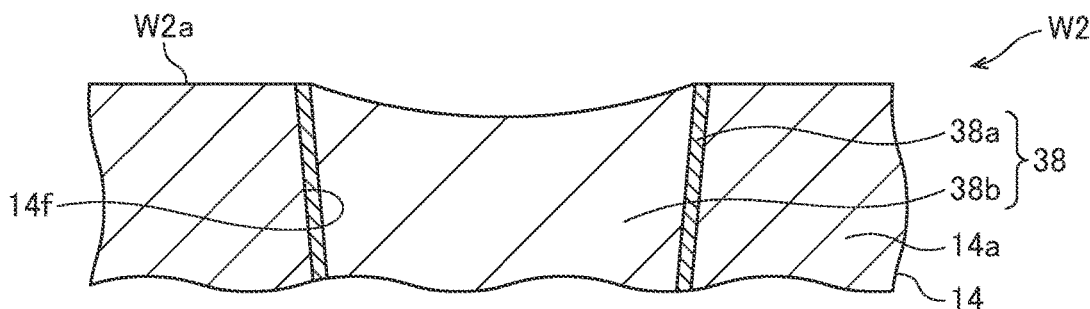
FIGS. 4A, 4B and 4C are cross-sectional diagrams illustrating part of the manufacturing process of the semiconductor device of the embodiment.

Subsequently, a polishing process of polishing the surface W1*a* of the array wafer W1 and the surface W2*a* of the circuit wafer W2 is performed. Specifically, the surface W1*a* of the array wafer W1 and the surface W2*a* of the circuit wafer W2 are polished using CMP (chemical mechanical polishing), or the like. In this event, for example, the interlayer dielectric 14 and the metal pad 38 are exposed on the surface W2*a* of the circuit wafer W2, and thus, in the polishing process, actually, the interlayer dielectric 14 and the metal pad 38 are polished. As described above, a material of the interlayer dielectric 14 is different from a material of the metal pad 38, and thus, as illustrated in FIG. 4(A), the surface of the metal pad 38 is more polished than the surface of the interlayer dielectric 14. As a result, while the surface of the interlayer dielectric 14 is formed to be flat, the surface of the metal pad 38 is formed to be slightly concave. The surface W1*a* of the array wafer W1 is polished in a similar manner.

Figure 4B:
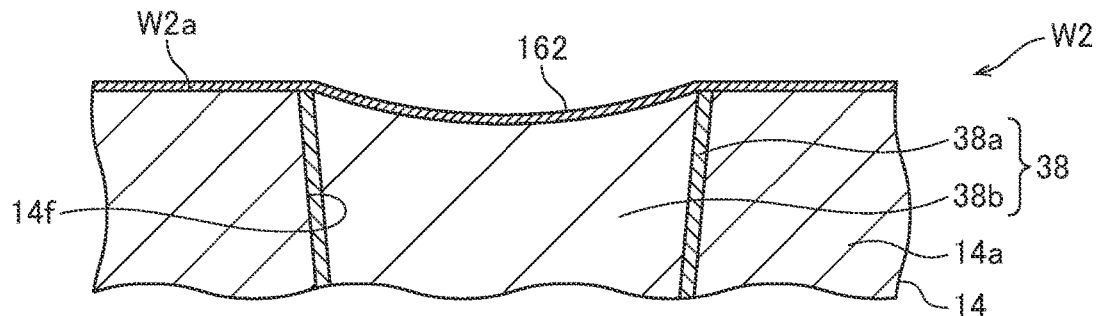

Subsequently, as illustrated in FIG. 4(B), a thin film 162 is formed on the surface W2*a* of the circuit wafer W2 using a PE-ALD (plasma enhanced-atomic layer deposition) method. Alternatively, a PE-CVD (plasma-enhanced chemical vapor deposition) method may be used. Specifically, by supplying a gas including Si such as monosilane ($SiH_4$) as a precursor and causing a gas including N such as ammonia ($NH_3$) or nitrogen ($N_2$) to flow over the surface W2*a* of the circuit wafer W2 to form an SiN film on the surface W2*a* of the circuit wafer W2. In a similar manner, a thin film 161 is formed also on the surface W1*a* of the array wafer W1.

Note that the thin films 161 and 162 are formed so that a total film thickness is equal to or less than 10 nm. For example, in a case where a film thickness of the thin film 161 is set at 5 nm, a film thickness of the thin film 162 is also set at 5 nm.

Figure 4C:
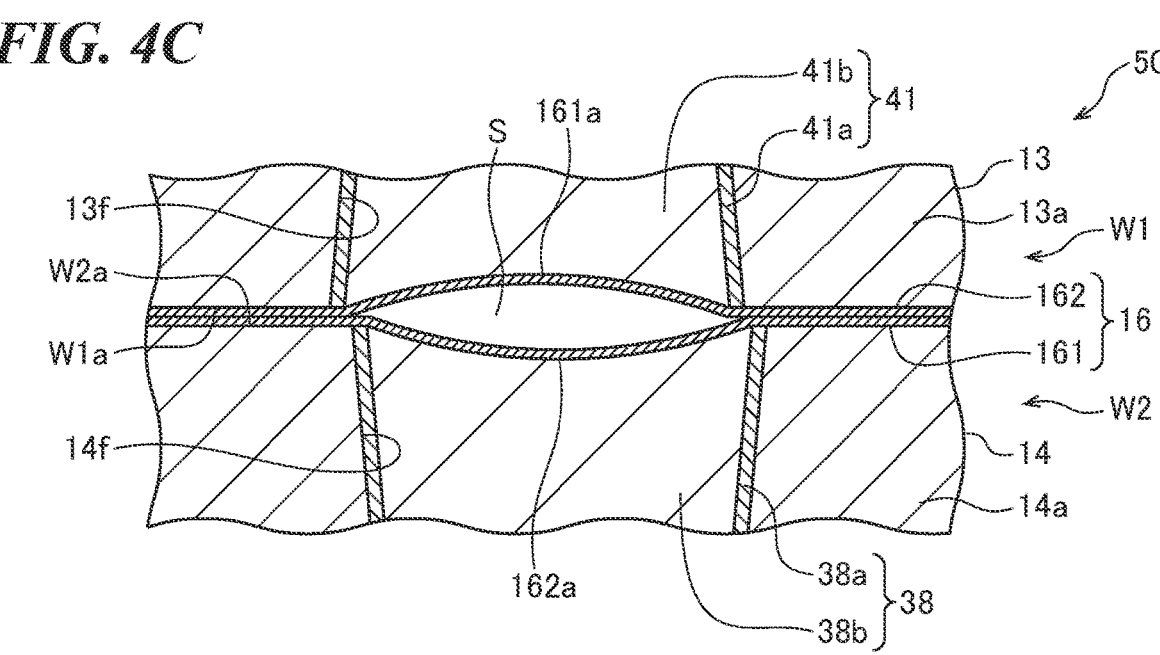
Figure 5:
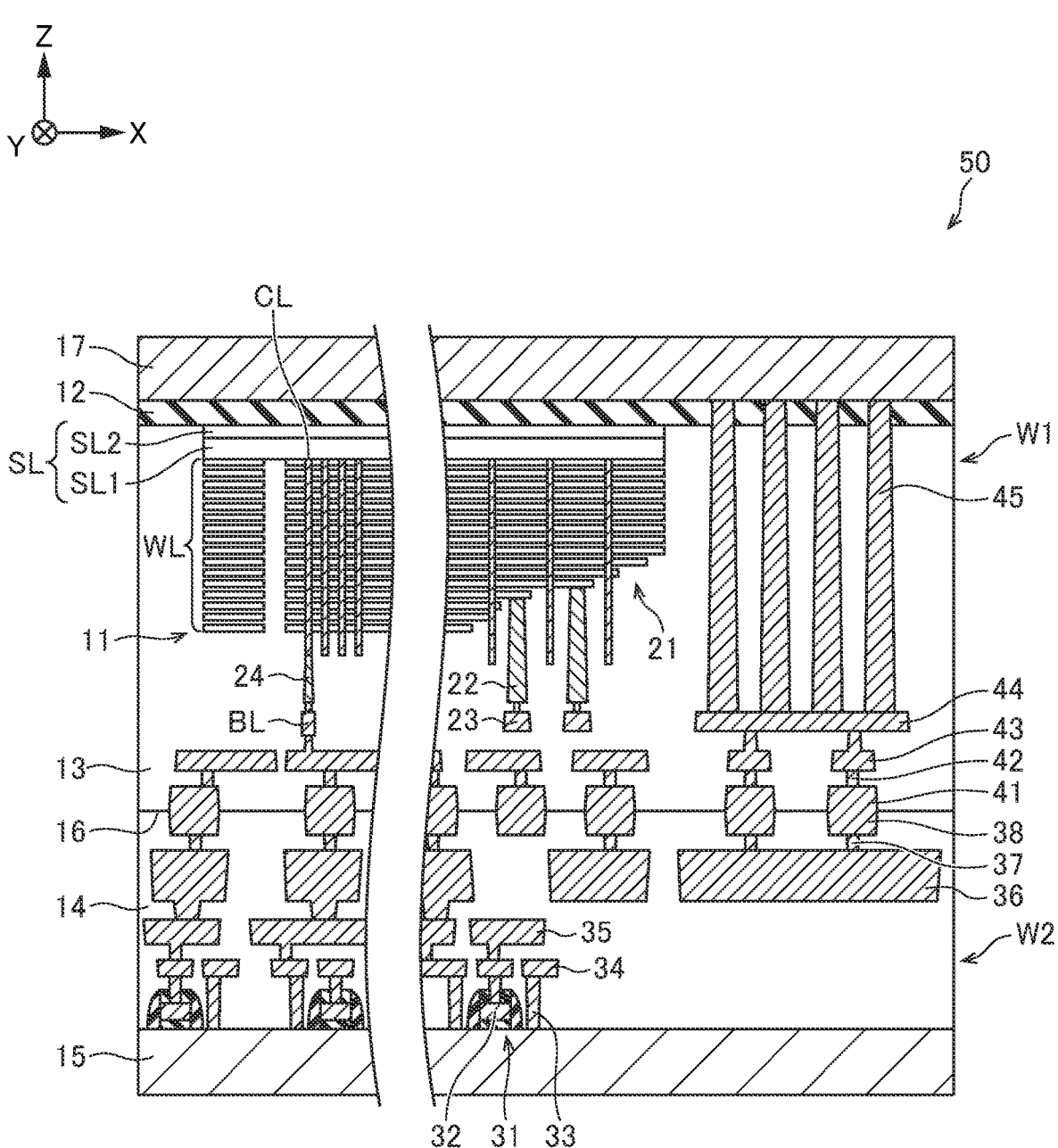
FIG. 5 is a cross-sectional diagram illustrating part of the manufacturing process of the semiconductor device of the embodiment.

Subsequently, a molded article 50 as illustrated in FIG. 5 is manufactured by inverting the array wafer W1 and then bringing the surface W1*a* of the array wafer W1 into contact with the surface W2*a* of the circuit wafer W2 and combining the wafers. Then, by providing a mechanical pressure to the molded article 50 in a vacuum atmosphere, the array wafer W1 is bonded to the circuit wafer W2. By this means, as illustrated in FIG. 4(C), the interlayer dielectric 13 of the array wafer W1 is bonded to the interlayer dielectric 14 of the circuit wafer W2. In this event, portions disposed between the interlayer dielectric 13 of the array wafer W1 and the interlayer dielectric 14 of the circuit wafer W2 among the thin films 161 and 162 are bonded to each other to form the thin film 16. Further, a surface of the metal pad 38 of the interlayer dielectric 13 and a surface of the metal pad 41 of the interlayer dielectric 14 are slightly concave, and thus, assuming that a portion disposed on the surface of the metal pad 38 among the thin film 162 is a thin film piece 162a, and a portion disposed on the surface of the metal pad 41 among the thin film 161 is a thin film piece 161a, a void S is formed between the thin film piece 161a and the thin film piece 162a.

Figure 6A:
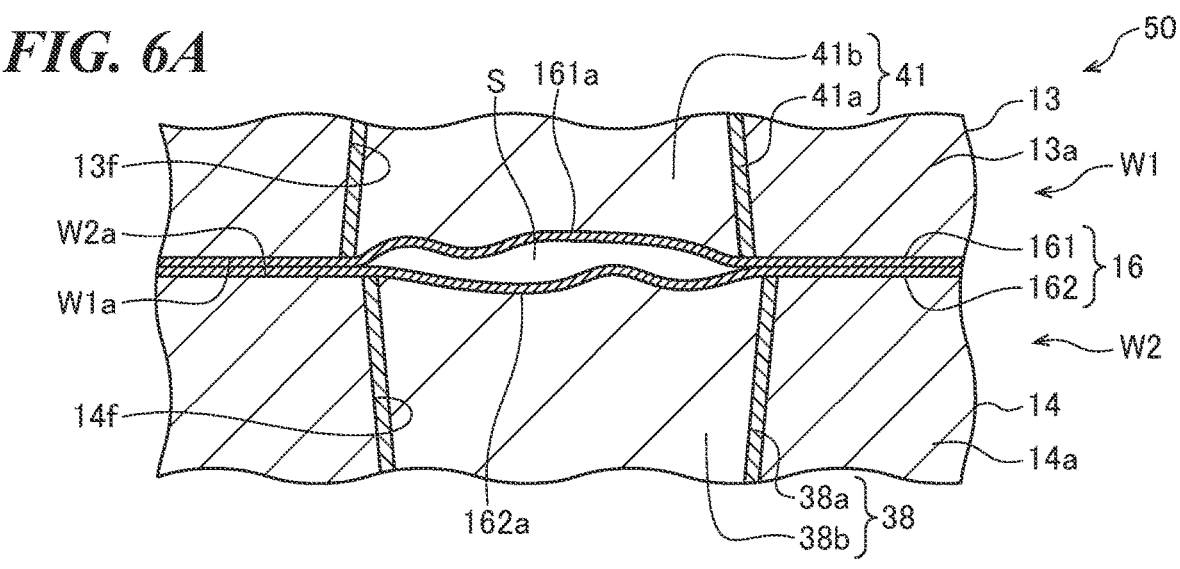
FIGS. 6A, 6B and 6C are cross-sectional diagrams illustrating part of the manufacturing process of the semiconductor device of the embodiment.
Figure 6B:
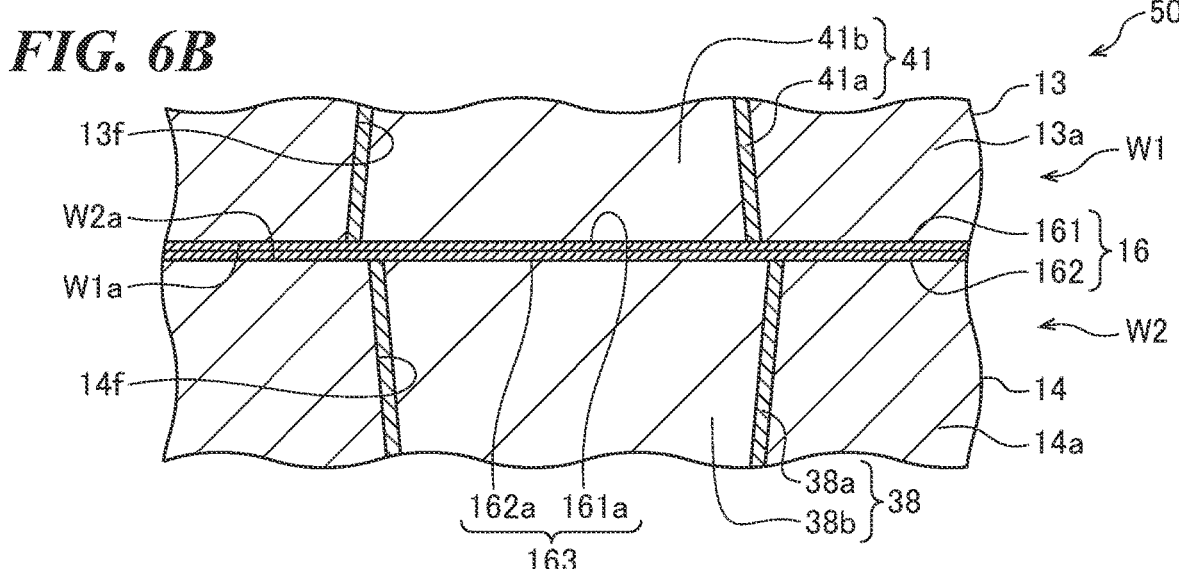

Then, the metal pad 38 is bonded to the metal pad 41 by performing annealing treatment on the molded article 50. In an initial stage of the annealing treatment, as illustrated in FIG. 6(A), the pad material layer 38b of the metal pad 38 and the pad material layer 41b of the metal pad 41 are thermally expanded. By this means, the thin film pieces 161a and 162a are extended in a convex shape toward the void S. If the metal pad 38 and the metal pad 41 are further thermally expanded, the thin film piece 161a has surface contact with the thin film piece 162a. Thus, as illustrated in FIG. 6(B), the void S formed between the surface of the metal pad 38 of the interlayer dielectric 13 and the surface of the metal pad 41 of the interlayer dielectric 14 disappears. This is because by forming the thin film pieces 161a and 162a, the surface of the metal pad 38 has point contact with the surface of the metal pad 41, which prevents occurrence of a void. As a result, the thin film pieces 161a and 162a form one thin film piece 163.

Figure 6C:
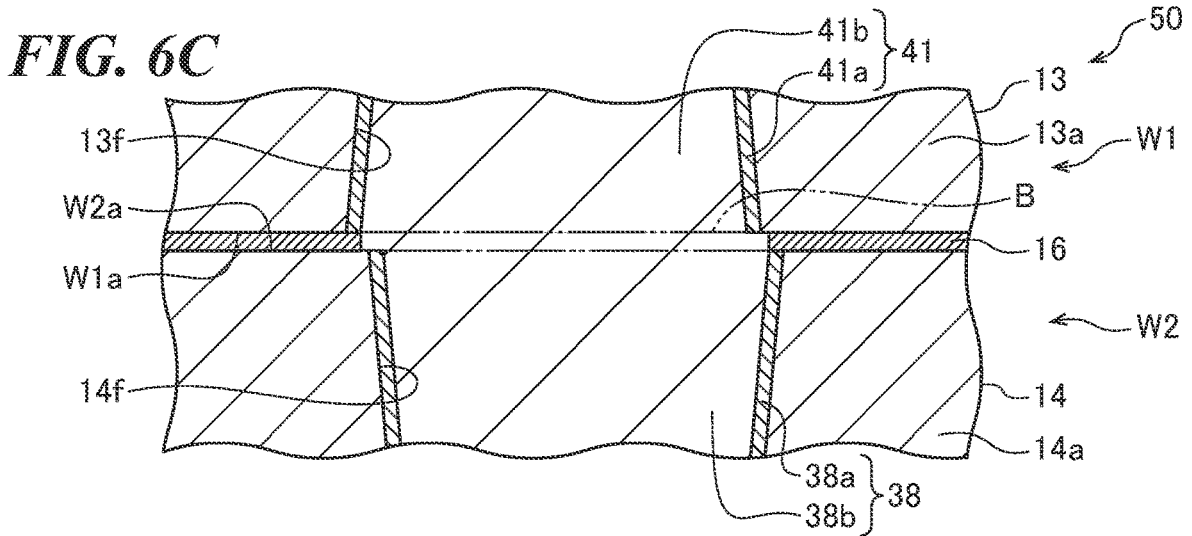

Then, if the pad material layer 38b of the metal pad 38 and the pad material layer 41b of the metal pad 41 are further thermally expanded, Cu included in the pad material layers is diffused to the whole thin film piece 163. By this means, as illustrated in FIG. 6(C), a portion at which the thin film piece 163 is disposed transitions to the boundary region B including copper and silicon. This results in electrically connecting the pad material layer 38b of the metal pad 38 to the pad material layer 41b of the metal pad 41.

By the way, in a case where the semiconductor device 10 is manufactured using such a method, for example, if the thin film piece 163 is too thick, Cu included in the pad material layers 38b and 41b of the metal pads 38 and 41 is difficult to be diffused to the whole thin film piece 163, which results in a possibility that the metal pad 38 is not electrically connected to the metal pad 41, that is, a possibility that a bonding defect occurs. The inventor therefore experimentally obtained a film thickness of the thin film piece 163, at which Cu of the metal pads 38 and 41 can be diffused to the thin film piece 163.

Figure 7:
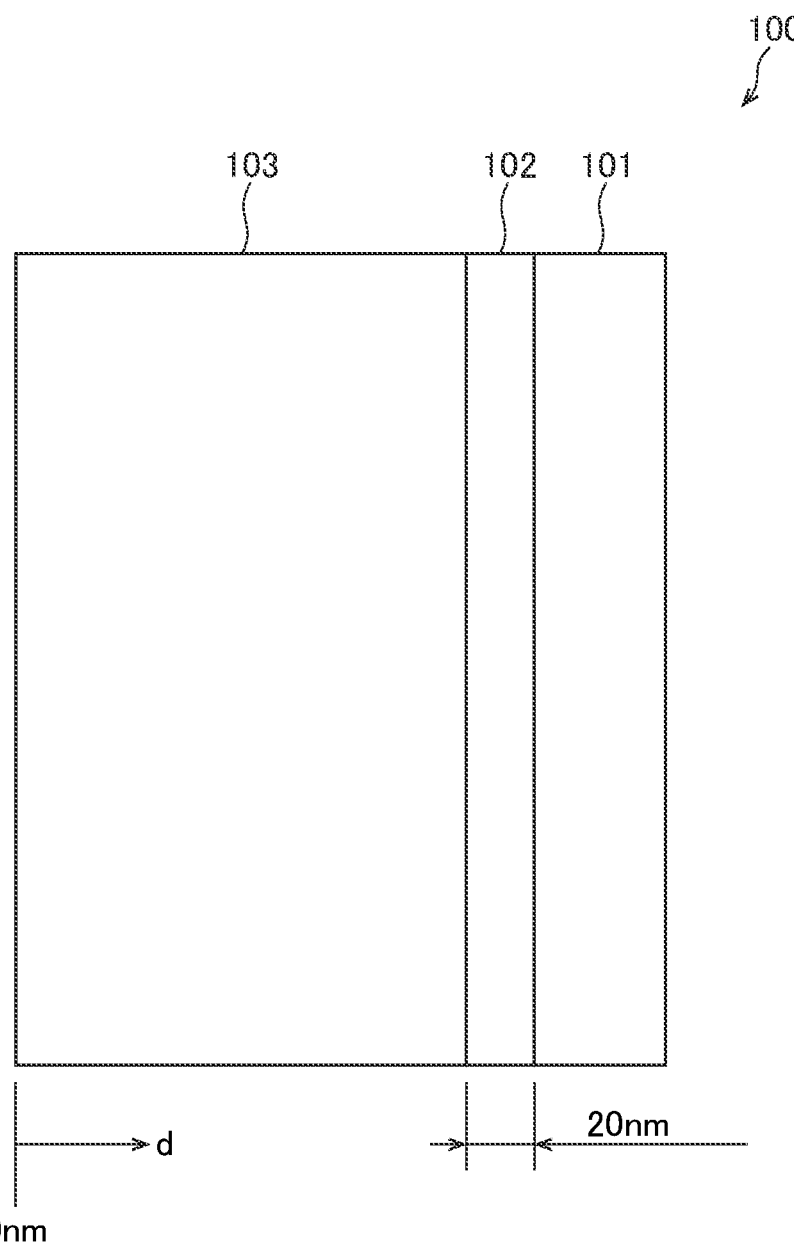
FIG. 7 is a front view illustrating a front structure of a sample of the embodiment.
Figure 8:
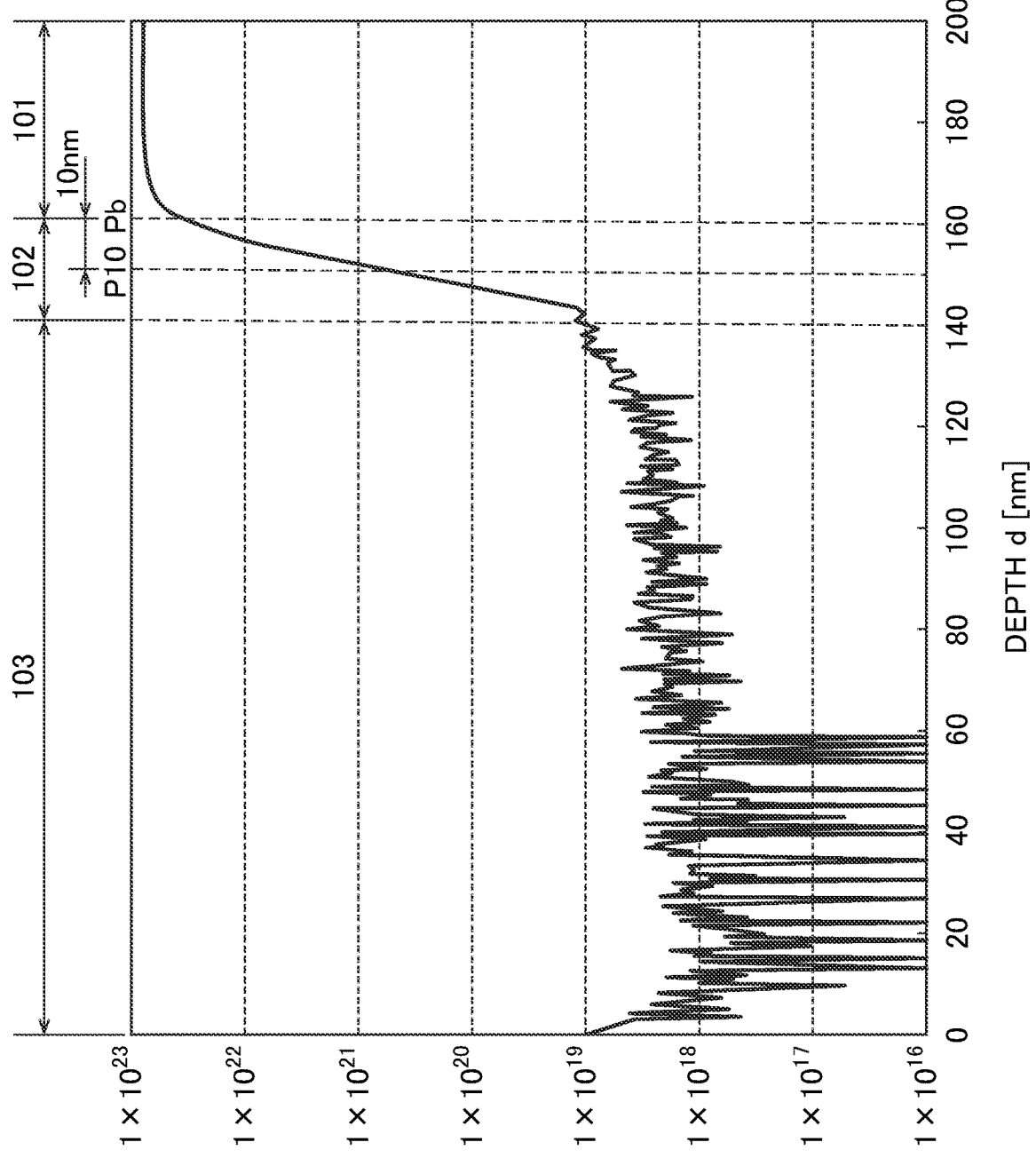
FIG. 8 is a graph indicating a relationship between a depth d of the sample and concentration of Cu atoms.

In the experiment of the inventor, a sample 100 as illustrated in FIG. 7 was used. As illustrated in FIG. 7, the sample 100 is constituted by a Cu layer 101, a cap layer 102 and an insulating film 103 being laminated. The cap layer 102 is an SiN film of 20 nm. The insulating film 103 is an $SiO_2$ film. Concerning such a sample 100, concentration distribution of Cu atoms is measured using elemental analysis such as EDX (energy dispersive X-ray spectroscopy). FIG. 8 is a graph of the measurement results. The graph indicated in FIG. 8 indicates a depth d of the sample 100 on a horizontal axis and indicates concentration of Cu atoms (atoms/cc) on a vertical axis to indicate a relationship between the depth d of the sample 100 and the concentration of Cu atoms. As illustrated in FIG. 7, the depth d of the sample 100 is defined as a depth from a surface (0 nm) of the insulating film 103. Note that cc represents a volume.

As illustrated in FIG. 8, the concentration of Cu atoms gradually decreases from the boundary portion of the Cu layer 101 and the cap layer 102 toward the insulating film 103. Specifically, in a case where the boundary portion of the Cu layer 101 and the cap layer 102 is set as a reference position Pb, the concentration of Cu atoms is equal to or greater than $1×10^{20}$ atoms/cc in a portion P10 that is a portion moving from the reference position Pb by 10 nm toward inside of the cap layer 102. If Cu atoms of equal to or greater than $1×10^{20}$ atoms/cc are included in the cap layer 102, it is possible to determine that Cu atoms are diffused in the cap layer 102. Thus, if a film thickness of the cap layer 102 is equal to or less than 10 nm, it can be understood that Cu atoms in the Cu layer 101 can be diffused to the insulating film 103. Further, if the film thickness of the cap layer 102 exceeds 10 nm, it can be understood that Cu atoms in the Cu layer 101 are difficult to be diffused to the insulating film 103.

On the basis of the experiment results illustrated in FIG. 8, in the semiconductor device 10 of the present embodiment, a setting is made so that a total thickness of the thin films 161 and 162 illustrated in FIG. 4(C) is equal to or less than 10 nm, that is, film thicknesses of the thin film 16 and the thin film piece 163 illustrated in FIG. 6(B) are each equal to or less than 10 nm to electrically connect the metal pad 38 the metal pad 41.

As described above, in the manufacturing method of the semiconductor device 10 of the present embodiment, as illustrated in FIG. 3, the metal pad 38 is formed in the interlayer dielectric 13 so as to be exposed from the surface W1a, the metal pad 41 is formed in the interlayer dielectric 14 so as to be exposed from the surface W2a, and the thin films 161 and 162 are respectively formed on the surface W1a of the interlayer dielectric 13 and the surface W2a of the interlayer dielectric 14. Then, annealing treatment is performed after the surface W1a of the interlayer dielectric 13 is bonded to the surface W2a of the interlayer dielectric 14 so that the metal pad 38 faces the metal pad 41. By manufacturing the semiconductor device 10 using such a method, concentration of silicon atoms in the boundary region B of the metal pad 38 and the metal pad 41 becomes greater than concentration of silicon atoms in the internal portion P1 of the metal pad 41 in the direction J1 in FIG. 2 from the boundary region B and becomes greater than concentration of silicon atoms in the internal portion P2 of the metal pad 38 in the direction J2 in FIG. 2 from the boundary region B. In the present embodiment, the internal portion P1 of the metal pad 41 corresponds to a first portion of the first metal pad, and the internal portion P2 of the metal pad 38 corresponds to a second portion of the second metal pad. According to this manufacturing method and configuration, as illustrated in FIG. 6(B) and FIG. 6(C), a void S is less likely to be formed between the surface of the metal pad 38 of the interlayer dielectric 13 and the surface of the metal pad 41 of the interlayer dielectric 14. Thus, the metal pad 38 is favorably bonded to the metal pad 41, which makes it difficult to cause a defect in conduction, or the like, between the metal pads 38 and 41.

In the semiconductor device 10 of the present embodiment, the thin film 16 has a thickness equal to or less than 10 nm. According to this configuration, copper in the metal pads 38 and 41 is easily diffused to the whole thin film piece 163, so that it is possible to electrically connect the metal pads 38 and 41 more accurately.

2. Other Embodiments

The present disclosure is not limited to the above-described specific embodiment.

For example, when the semiconductor device 10 is manufactured, as illustrated in FIG. 4(C), in place of a method in which the thin films 161 and 162 are respectively formed on the surface W1a of the interlayer dielectric 13 and the surface W2a of the interlayer dielectric 14, a method in which a thin film is formed on one of the surface W1a of the interlayer dielectric 13 and the surface W2a of the interlayer dielectric 14 may be employed. In this event, to connect the metal pads 38 and 41 more reliably, a thickness of the thin film formed on one of the surface W1a of the interlayer dielectric 13 and the surface W2a of the interlayer dielectric 14 is preferably set at equal to or less than 10 nm.

Figure 9:
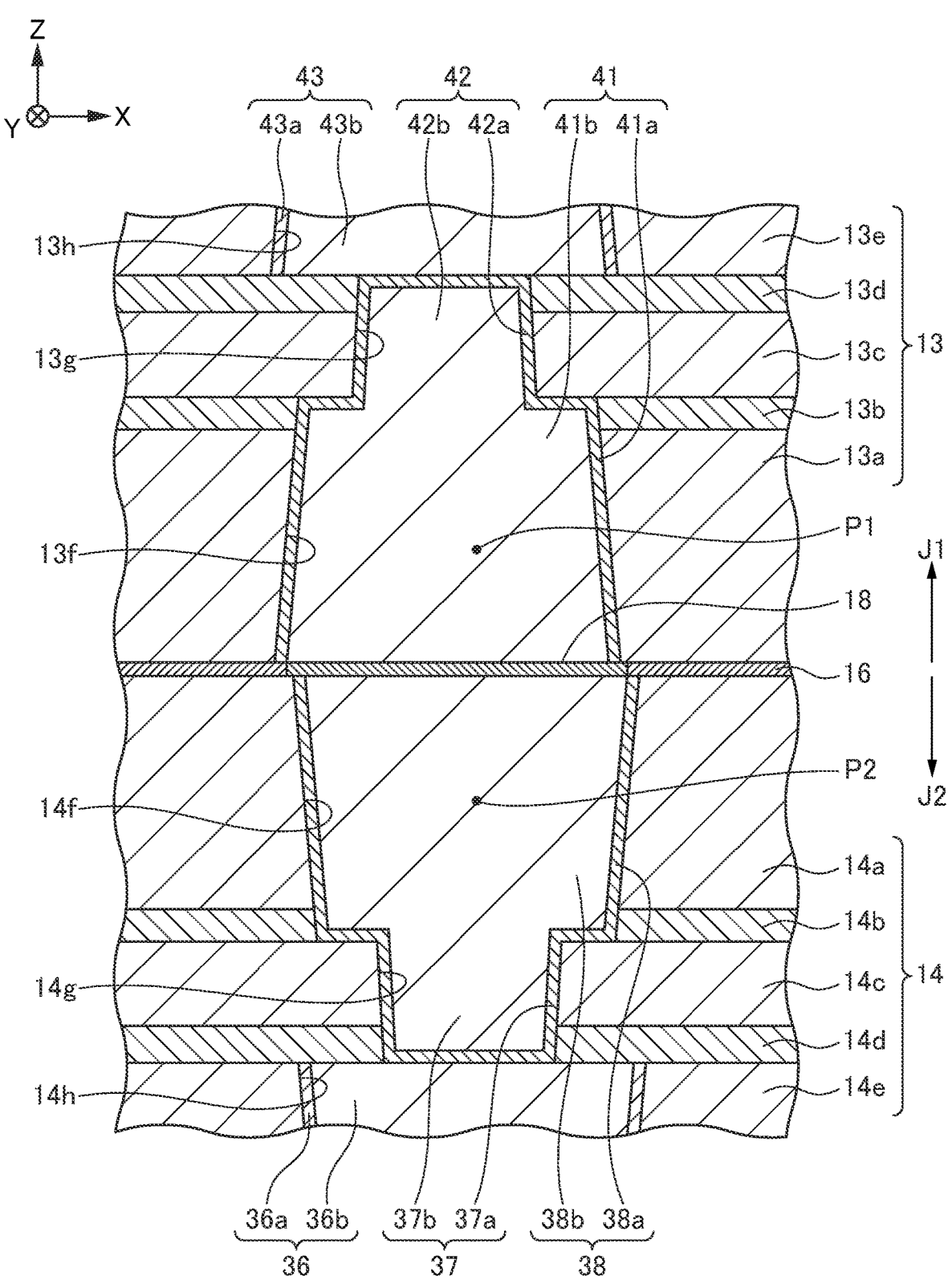
FIG. 9 is a cross-sectional diagram illustrating a cross-section structure of a portion around a metal pad of a semiconductor device of another embodiment.

As illustrated in FIG. 9, a thin film 18 may be provided between the metal pad 38 and the metal pad 41. The thin film 18 only requires to include silicon and copper.

While some embodiments of the present invention have been described, these embodiments are presented as examples and are not intended to limit a scope of the invention. These new embodiments can be implemented in other various forms, and various omission, replacement and changes can be made within a range not deviating from the gist of the invention. These embodiments and modifications of the embodiments are incorporated into the scope and the gist of the invention and incorporated into the inventions recited in the claims and an equivalent range of the inventions.

What is claimed is:

1. A semiconductor device comprising:
a substrate;
a first insulating film provided above the substrate;
a second insulating film disposed between the substrate and the first insulating film;
a third insulating film provided between the first insulating film and the second insulating film, the third insulating film being in contact with the first insulating film and the second insulating film;
a memory cell array provided in the first insulating film;
a control circuit provided in the second insulating film and configured to control the memory cell array;
a first metal pad provided in the first insulating film;
a second metal pad provided in the second insulating film, the second metal pad being electrically connected to the first metal pad;
a first plug provided in the first insulating layer to electrically connect the memory cell array to the first metal pad and contacting with the first metal pad;
a second plug provided in the second insulating layer to electrically connect the control circuit to the second metal pad and contacting with the second metal pad; and
a layer provided between the first metal pad and the second metal pad, directly in physical contact with the first metal pad and the second metal pad, and the layer including silicon and copper,
wherein
the second metal pad is electrically connected to the first metal pad via the layer,
a thickness of the layer is smaller than a thickness of the first metal pad, smaller than a thickness of the second metal pad, and equal to a thickness of the third insulating film,
a thickness of the third insulating film is equal to or less than 10 nm, and a width of the layer is equal to or greater than a width of the first metal pad.

2. The semiconductor device according to claim 1, wherein
the third insulating film includes nitrogen.

3. The semiconductor device according to claim 2, wherein the third insulating film further includes silicon.

4. The semiconductor device according to claim 2, wherein the third insulating film further includes carbon.

5. The semiconductor device according to claim 1, wherein the first metal pad and the second metal pad include copper.

6. The semiconductor device according to claim 1, wherein the first metal pad and the second metal pad are provided between the substrate and the memory cell array, and
the memory cell array includes a plurality of electrode layers extending in a first direction horizontal to a surface of the substrate and a columnar portion passing through the plurality of electrode layers in a second direction intersects with the first direction.

7. A semiconductor device comprising:
a substrate;
a first insulating film provided above the substrate;
a second insulating film disposed between the substrate and the first insulating film;
a third insulating film provided between the first insulating film and the second insulating film, the third insulating film including nitrogen and being in contact with the first insulating film and the second insulating film;
a memory cell array provided in the first insulating film;
a control circuit provided in the second insulating film and configured to control the memory cell array;
a first metal pad provided in the first insulating film;
a second metal pad provided in the second insulating film, the second metal pad being electrically connected to the first metal pad;
a first plug provided in the first insulating layer to electrically connect the memory cell array to the first metal pad and contacting with the first metal pad;
a second plug provided in the second insulating layer to electrically connect the control circuit to the second metal pad and contacting with the second metal pad; and
a layer provided between the first metal pad and the second metal pad at a position corresponding to the third insulating film, the layer being in direct contact with the first metal pad and the second metal pad and including silicon and copper, wherein
a thickness of the third insulating film and a thickness of the layer are both equal to or less than 10 nm,
the second metal pad is electrically connected to the first metal pad via the layer,
the first insulating film including a fourth insulating film, a fifth insulating film, a sixth insulating film, and a seventh insulating film, the fourth insulating film is provided adjacent to the third insulating film and the fourth insulating film is provided around a portion excluding a bottom of the first metal pad, the fifth insulating film is provided around a portion excluding a bottom of the first plug, the sixth insulating film is provided around the bottom of the first metal pad to be sandwiched between the fourth insulating film and the fifth insulating film, and the seventh insulating film is provided around the bottom of the first plug, and the second insulating film including an eighth insulating film, a ninth insulating film, a tenth insulating film, and an eleventh insulating film, the eighth insulating film is provided adjacent to the third insulating film and the eighth insulating film is provided around a portion excluding a bottom of the second metal pad, the ninth insulating film is provided around a portion excluding a bottom of the second plug, the tenth insulating film is provided around the bottom of the second metal pad to be sandwiched between the eight insulating film and the ninth insulating film, and the eleventh insulating film is provided around the bottom of the second plug.

8. The semiconductor device according to claim 1, wherein
the third insulating film is one of SiO2 film, a SiN film, and a SiCN film.

9. The semiconductor device according to claim 1, wherein
the first insulating film including a fourth insulating film, a fifth insulating film, a sixth insulating film, and a seventh insulating film, the fourth insulating film is provided adjacent to the third insulating film and the fourth insulating film is provided around a portion excluding a bottom of the first metal pad, the fifth insulating film is provided around a portion excluding a bottom of the first plug, the sixth insulating film is provided around the bottom of the first metal pad to be sandwiched between the fourth insulating film and the fifth insulating film, and the seventh insulating film is provided around the bottom of the first plug, and
the second insulating film including an eighth insulating film, a ninth insulating film, a tenth insulating film, and an eleventh insulating film, the eighth insulating film is provided adjacent to the third insulating film and the eighth insulating film is provided around a portion excluding a bottom of the second metal pad, the ninth insulating film is provided around a portion excluding a bottom of the second plug, the tenth insulating film is provided around the bottom of the second metal pad to be sandwiched between the eighth insulating film and the ninth insulating film, and the eleventh insulating film is provided around the bottom of the second plug.

10. The semiconductor device according to claim 1, wherein
the first metal pad includes copper, the second metal pad includes copper, and
the layer is formed by thermal expansion of the first metal pad and the second metal pad, and diffusion of copper from the first metal pad and the second metal pad toward the third insulating film.

11. The semiconductor device according to claim 7, wherein
the third insulating film is one of a SiN film and a SiCN film.

12. The semiconductor device according to claim 7, wherein
the first metal pad includes copper,
the second metal pad includes copper, and
the layer is formed by thermal expansion of the first metal pad and the second metal pad, and diffusion of copper from the first metal pad and the second metal pad toward the third insulating film.

13. A semiconductor device comprising:
a substrate;
a first insulating film provided above the substrate;
a second insulating film disposed between the substrate and the first insulating film;
a first metal pad provided in the first insulating film;
a second metal pad provided in the second insulating film, the second metal pad being electrically connected to the first metal pad;
a third insulating film provided between the first insulating film and the second insulating film, the third insulating film including nitrogen and being in contact with the first insulating film and the second insulating film; and
a layer provided between the first metal pad and the second metal pad at a position corresponding to the third insulating film, the layer being in direct contact with the first metal pad and the second metal pad and including silicon and copper, wherein
a thickness of the third insulating film and a thickness of the layer are both 10 nm or less
the first metal pad includes copper,
the second metal pad includes copper, and
the layer is formed by thermal expansion of the first metal pad and the second metal pad, and diffusion of copper from the first metal pad and the second metal pad toward the third insulating film.

* * * * *